United States Patent [19]

Bonifield et al.

[11] Patent Number: 4,758,305

[45] Date of Patent: Jul. 19, 1988

[54] CONTACT ETCH METHOD

[75] Inventors: Thomas D. Bonifield; Vic B. Marriott, Both of Dallas; Rhett B. Jucha, Celeste; Monte A. Douglas, Dallas, all of Tex.

[73] Assignee: Texas Instruments Incorporated, Dallas, Tex.

[21] Appl. No.: 838,965

[22] Filed: Mar. 11, 1986

[51] Int. Cl.$^4$ .................. B44C 1/22; B29C 37/00; C03C 15/00; C03C 25/06

[52] U.S. Cl. ................... 156/643; 156/644; 156/646; 156/653; 156/657; 156/661.1; 156/668; 156/904; 252/79.1; 427/43.1; 430/312; 430/313; 430/317

[58] Field of Search ............... 156/643, 644, 646, 653, 156/657, 659.1, 661.1, 662, 668, 904; 252/79.1; 204/164, 192 E; 427/38, 39, 43.1, 88; 430/312, 313, 317

[56] References Cited

U.S. PATENT DOCUMENTS

| | | | |
|---|---|---|---|
| 4,484,978 | 11/1984 | Keyser | 156/661.1 X |
| 4,508,591 | 4/1985 | Bartlett et al. | 156/659.1 |
| 4,522,681 | 6/1985 | Gorowitz | 156/643 |
| 4,523,976 | 6/1985 | Bukhman | 156/668 X |
| 4,557,797 | 12/1985 | Fuller et al. | 156/643 |

OTHER PUBLICATIONS

Lin et al., Some Aspects of Anti-Reflective Coating for Optical Lithography, SPIE vol. 469, Advances in Resist Tech. (1984), pp. 30-34, 36 and 37.

Lin et al., Use of Anti-Reflective Coating in Bilayer Resist Process, 1983, International Symposium on Electron, Ion and Photon Beams, May 31-Jun 3, 1983.

Saia et al., Dry Etching of Tapered Contact Holes using Multilayer Resist, J. Electrochem, Soc. Solid-State Science & Tech. Aug. 1985, pp. 1954-1957, vol. 132, No. 8.

Reynolds et al., Studies of Plasma Etching Mechanisms with Cantilever, Electronics Research Lab., University of California, pp. 61-74.

Bonifield et al., Sloped Contact Ething, Plasma Seminar Proceedings 1985, pp 25-29.

Rothman et al., Process for Forming Tapered Vias In SiO$_2$ by Reactive ION Etching, IBM Data Systems Division, pp. 193-198.

Primary Examiner—William A. Powell
Attorney, Agent, or Firm—Robert Groover III

[57] ABSTRACT

A method for patterning small-geometry contacts with sloped sidewalls in integrated circuit fabrication. A multilayer resist process is used, and the spacer layer is undercut by overexposure and overdevelopment at the pattern transfer stage. This provides a cantilever etch mask structure, without the need to use any hardmask layers.

8 Claims, 4 Drawing Sheets

SI400-27 PHOTORESIST
ANTI-REFLECTIVE COATING

PMMA

OXIDE

SILICON 0.0 MICRON 1.0 MICRON 1.5 MICRON 2.5 MICRONS 3.5 MICRONS 4.5 MICRONS

CONTACT ETCH METHOD

BACKGROUND AND SUMMARY OF THE INVENTION

The present invention reelates to methods of manufacturing integrated circuits.

As the dimensions of microcircuit elements continue to decrease, the ability to control the etched sidewall profiles of contact holes or vias (particularly in the size range of 0.8 to 1.25 microns, and below) becomes increasingly difficult, and also increasingly critical. Of even more importance is the coverage of sidewalls with deposited metal. Traditionally the contacts have been sloped by reflowing doped oxide, but this method has serious disadvantages: it can seriously degrade contact resistance in CMOS circuits, and for small contact holes the size of the opening is difficult to control. Although substantial efforts (with some success) have been devoted to lowering the temperatures required for reflow, reflow methods are inherently high temperature steps.

One common method used to slope contact holes is the resist erosion (resist etchback) technique. With this method the resist is patterned with 50 to 60 degree slopes. This is followed with a plasma oxide etch with a high resist etch rate, which serves to transfer the resist slope into the oxide and then a plasma overetch with selectivity to underlying silicon to yield slopes in the range of 60 to 70 degrees. The principal problem with this method is the difficulty in controlling the resist slope, especially at sizes close to 1.0 micron. Resist loss greater than 0.7 micron is necessary to transfer the slope into the silicon oxide, which can cause oxide failures where the resist thins over steps. Also, the contact hole enlarges during the overetch, typically by 0.3 to 0.4 microns. This problem is discussed in Saia and Gorowitz, *Dry Etching of Tapered Contact Holes Using Multilayer Resist*, 132 J. ELECTROCHEMICAL SOCIETY: SOLID-STATE SCIENCE AND TECHNOLOGY p. 1954 (1985), which is hereby incorporated by reference.

One known technique which has provided some success is the use of a cantilever mask to obtain sloped sidewalls. The technique involves elevating the mask above the substrate with an undercut spacer layer. Such a structure allows etching to occur under the elevated mask. Due to the properties of the ions as they bombard the oxide surface, as the distance the ions travel increases there is a continuing decrease of the etch rate thereby generating nicely contoured wall profiles. See Rothman, Mauer, Schwartz, and Logan, *Process for Forming Tapered Vias in SiO2 by Reactive Ion Etching*, in PROCEEDINGS OF THE SYMPOSIUM ON PLASMA ETCHING AND DEPOSITION, 193 (1982), which is hereby incorporated by reference; and Reynolds, Hollins, and Neureuther, Studies of Plasma Etching Mechanisms with Cantilever Structures, in PROCEEDINGS OF THE SYMPOSIUM ON PLASMA ETCHING AND DEPOSITION, Electrochemical Society, 61 (1983), which is hereby incorporated by reference.

The usual method of generating the cantilever structure is the use of a trilayer resist scheme. With this method standard photoresist is used to mask a hard inorganic layer over a spacer of thick photoresist hardbaked at 180° C. or greater. The hardened photoresist is undercut (from under the patterned hardmask layer) with a dry etch, and the oxide is etched to produce the sloped contacts desired. However, this method has substantial drawbacks, namely the complication of the added etch and deposition steps, the difficulty inspecting alignment through the several layers, and the difficulty in removing the hard mask after etch of the contact. See Bonifield, Douglas, Huffman, and Dennington, *Sloped Contact Etching*, in TEGAL: PLASMA SEMINAR PROCEEDINGS (1985), which is hereby incorporated by reference; and Bonifield and Douglas, *Cantilevered Masks for Sloped Sidewalls on Plasma Etched Dielectrics*, in IEEE Lithography Workshop (1984), which is hereby incorporated by reference.

The present invention provides a much simpler and more manufacturable method of producing cantilever etch masks using a simple modification of a multilayer resist scheme, the sestertius resist process.

The sestertius cantilever mask approach requires no extra etch or deposition steps, only the coating and developing of conventional lithographic materials; alignment is easy to inspect, and the stack is removed easily with standard resist stripping techniques.

The sestertius resist process is a modification of the Portable Conformable Mask technique in which a anti-reflective coating layer is applied between the photoresist and the PMMA to control standing waves and reflective notching in the top layer and prevent the formation of interfacial scum due to intermixing between the PMAA and the photoresist. See the paper by Lin in SPIE volume 174 (1979), which is hereby incorporated by reference. The sestertius process may be thought of as a "two and one-half" layer process, since the anti-reflective coating is coated in a separate step, but is etched during the development of the imaging layer. See Lin, Jones, and Fuller, *Use of Anti-reflective Coating in Bilayer Resist Processes*, JOURNAL OF VACUUM SCIENCE AND TECHNOLOGY B1, (1983), which is hereby incorporated by reference, and Lin, Marriott, Orvek, and Fuller, *Some Aspects of Anti-reflective Coating for Optical Lithography*, in SPIE VOLUME 469, ADVANCES IN RESIST TECHNOLOGY (1984), which is hereby incorporated by reference.

In the present invention, the cantilever structure is very conveniently obtained by overexposing and overdeveloping the PMMA, which is a non-critical step.

That is, the method of the present invention not only provides additional advantages over the sestertius method, but is also more manufacturable. The pattern transfer step, wherein the developed pattern in the top layer is exposed to transfer it into the spacer layer, was a tricky step in the sestertius process, but in the present invention this step is not critical at all, since very large overexposure and overdevelopment margins are used.

Thus, the present invention provides at least the following advantages, in addition to others mentioned in this application:

it requires only a one step etch which is selective to silicon.

the slope of the contact is determined primarily by the cantilevered mask spacer thickness.

the sizing of the contact is determined by the size of the printed contact in the top imaging layer.

the sestertius resist is removed in a standard resist strip process.

it uses a high resolution multilayer resist process.

the etch profile has naturally rounded corners.

BRIEF DESCRIPTION OF THE DRAWINGS

The present invention will be described with reference to the accompanying drawings, wherein.

DESCRIPTION OF THE PREFERRED EMBODIMENTS

Figure 1:
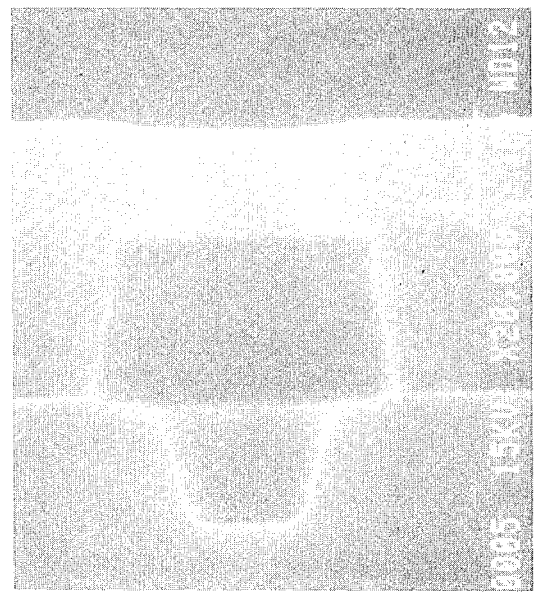
FIG. 1 shows a cross-section of a sestertius cantilever mask with the contact etched (the layers shown are, from the top down, S1400-27 Photoresist, Anti-reflective coating, PMMA, oxide, and Silicon)

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

In a sample embodiment of the invention, the sloped contacts from the sestertius cantilever mask approach are obtained in the following sequence:

1. Pre-bake to dehydrate the oxide surface at 200° C. on a hot plate and prime with HMDS (i.e. hexamethyldisilazane) in the vapor phase.
2. The PMMA is applied with either single or double coating at various spin speeds to obtain PMMA thicknesses from 1.0 to 4.5 microns depending on the desired spacer thickness. The PMMA is baked at 260° C. for 120 seconds to yield planarization.
3. The anti-reflective coating (ARC, a product of Brewer Science, Rolla, Mo.) is applied and baked on a hot plate at a temperature that allows for slight undercut of the ARC under the resist so that the ARC does not affect the size of the contact opening.
4. Shipley S1400-27 is coated directly on the ARC at a thickness of 1.1 microns and soft baked at 100° C. for 60 seconds.
5. Exposure of the contacts into the S1400-27 imaging layer is done on an stepper using a reticle with nominal contact sizes of 1.0 microns.
6. The resist was post exposure baked at 110° C. for 60 sec on a hot plate.
7. Development of the resist and simultaneously the etch of the ARC is accomplished with Shipley MF-314 developer in a 35 second spray.
8. Pattern transfer into the PMMA is accomplished with blanket deep UV exposure, using light in the range of 220 nm and development with chlorobenzene. The cantilever structure is produced by using 300 percent overexposure and overdevelopment. For example, in the embodiment as presently practiced, the PMMA is exposed at a source power per unit area of approximately 40 mW/cm$^2$ for 300 seconds, and this is followed by a 240 second spray develop with chlorobenzene. Normally some overexposure and overdevelopment (e.g. 20% or so) is used to avoid geometry sensitivity and provide processing latitude; but the present invention teaches that the amount of overexposure and overdevelopment should be radically increased over what would otherwise be used, to at least 100% (and preferably much more) overexposure and overdevelopment. That is, in normal processing it is specifically a goal, in calculating exposure and development times, not to undercut the photosensitve layer; but in the present invention, when the PMMA is exposed and developed it is specifically a goal to undercut the photosensitive PMMA. As a general formulation, the overexposure and overdevelopment conditions used in the preferred embodiment may be stated as: either (A) The PMMA is exposed for a time at least twice (and preferably triple or more) the duration required to completely expose portions of the PMMA beneath the center of the patterned contact openings in the top layer; or (B) The PMMA is developed, after exposure, for at least twice the duration required to clear the portions of the PMMA directly beneath the centers of patterned contact openings in the top layer; and preferably the PMMA is both overexposed and overdeveloped.

The particulars of the succeeding plasma etch step are as follows:

9. The material is hard baked at 120° C. in a convection bake oven for 30 min.
10. The wafers are then etched in a single wafer oxide plasma reactor. Depending on the spacer thickness, the overetch is calculated. At a spacer height of 1.5–2.5 microns, a 100% overetch is used to clear 1.0 micron of oxide. The etch process uses $C_2F_6$ and $CHF_3$ as the principal etchants. Normal oxide processing is accomplished with a 6:1 selectivity of thermal oxide to undoped polysilicon. For sloped contact processing, the ratio of $CHF_3/C_2F_6$ is increased until the selectivity of oxide to polysilicon is 10:1. For example, the presently preferred embodiment uses 15 sccm of $C_2F_6$ and 90 sccm of $CHF_3$, together with 3 sccm of $O_2$ and 80 sccm of He, all at a pressure of 700 milliTorr and a substrate temperature of 5° C., in a single-slice plasma reactor.
11. After the etch, the resist is removed by ashing for 60 minutes in a Branson Barrel Asher.

FIG. 1 shows the sidewall profile for the resist, the undercut of the resist, and the etched resist sidewalls for cross sections through the contact holes for a spacer thickness of 1.5 microns.

Figure 2:
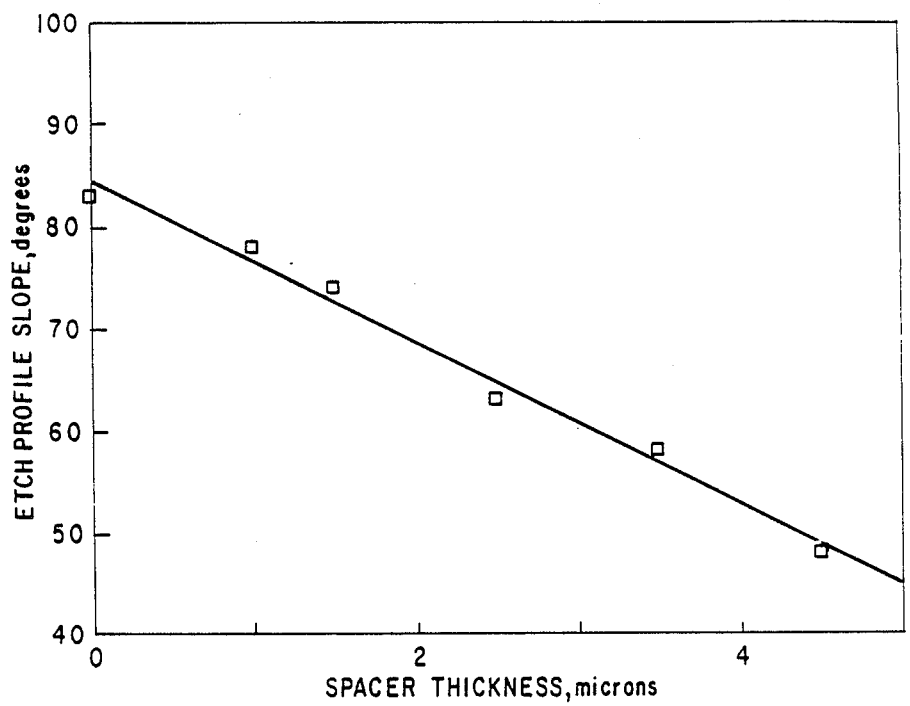
FIG. 2 shows the dependence of contact angle slope on the spacer layer's thickness.
Figure 3:
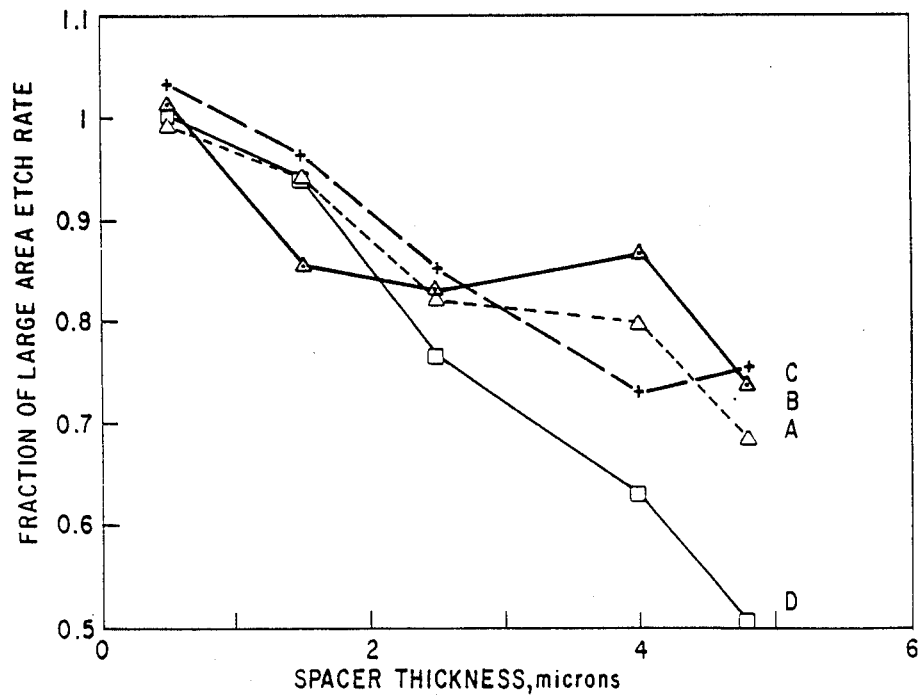
FIG. 3 shows the dependence of oxide etch rate on cantilever spacer thickness for two different oxide etch pressures (curves A and B used a 0.1 Torr process and curves C and D a 1.5 Torr process), and for two different contact sizes (curves A and C used 2.5×4.0 micron contact openings and curves B and D used 1.8×1.8 micron contact openings)
Figure 4A:
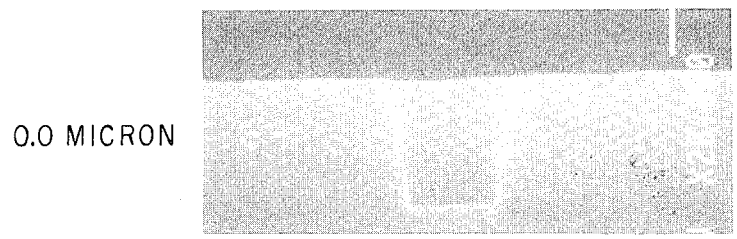
FIGS. 4a–4f shows contact angle slopes at different cantilever spacer thicknesses after resist ash.
Figure 4B:
Figure 4C:
Figure 4D:
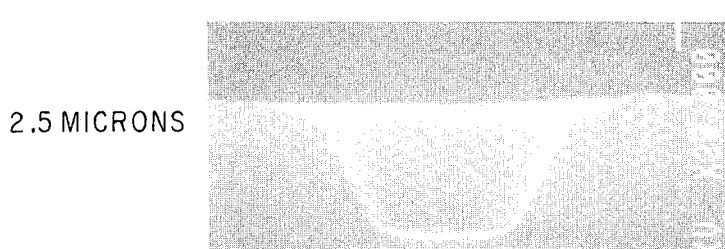
Figure 4E:
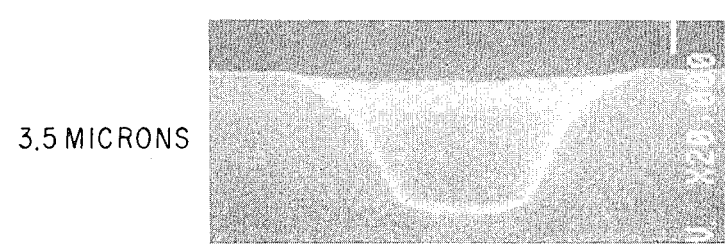
Figure 4F:
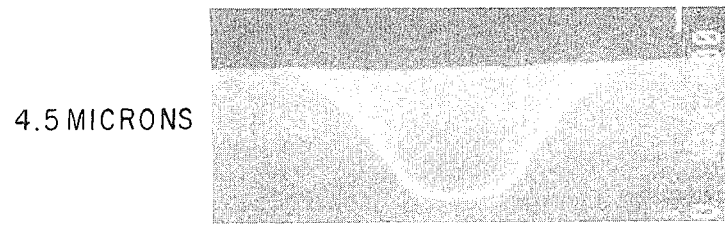

The slope achieved by the cantilever mask technique depends on the spacer thickness, as shown in FIG. 2. The slope is generated by the angular distribution of ion flux. Since the ion velocities are predominately perpendicular to the oxide surface, the ion flux decreases rapidly as the angle departs from vertical. Thus, the etch rate drops off under the mask in a gradual manner that reflects the drop off in ion flux and possibly in ion energy. As the spacer thickness increases, the greater mask height allows ions to hit the oxide surface further under the mask creating a greater slope. Note that as the mask height is increased, so is its aspect ratio causing a reduction in etch rate as is shown in FIG. 3, taken from Bonifield, et al. [4]

In FIG. 4 are SEM photographs of contacts etched into oxide with the sestertius resist removed for 0.0, 1.0, 1.5, 2.5, 3.5, and 4.5 microns of spacer. We have found that sidewall profiles corresponding to spacer thicknesses of 1.5 to 2.5 microns of resist work very well for the usual topographies encountered in a CMOS process.

Figure 5:
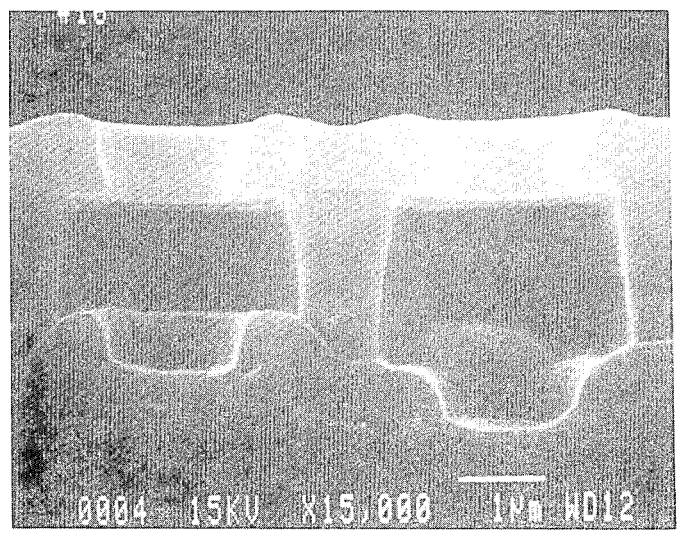
FIG. 5 shows cross-section of sestertius cantilever mask with 1.0 micron contacts etched on topography.

FIG. 5 shows etched contacts on topography: some variation of the slope of the sidewalls is apparent, but notice that the contact corners are rounded at the top and that the size of the contacts at the bottom are very close to the size of the openings in the imaging layer photoresist.

Figure 6B:
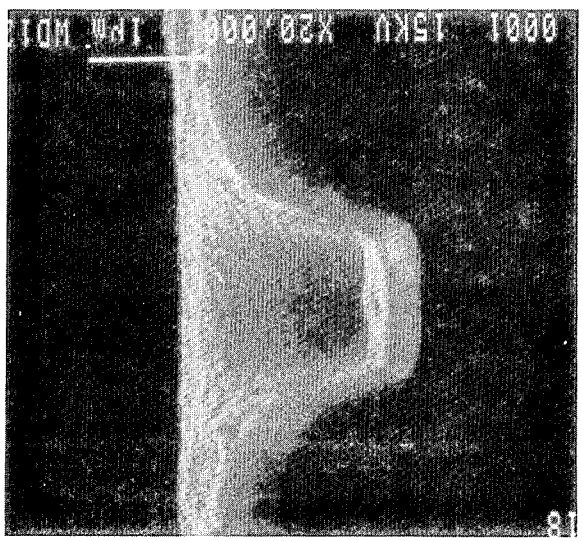
FIGS. 6(a) and 6(b) show a cross-section of 1.0 micron contacts with metal deposited over them, produced with (a) conventional single layer process, (b) sestertius cantilever mask with 2.5 micron spacer.
Figure 6A:
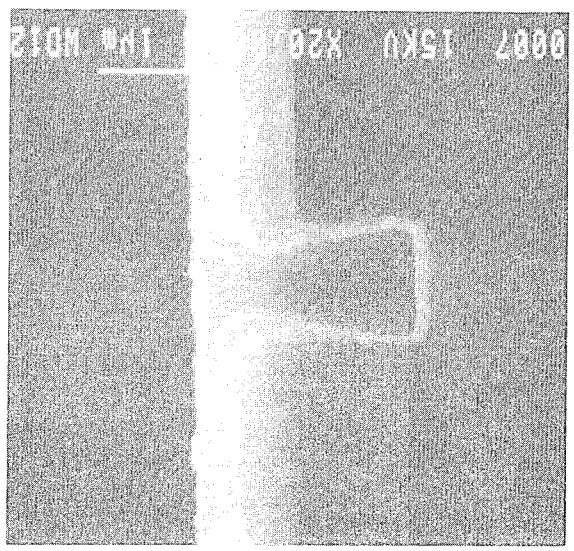

FIG. 6 shows contact holes with aluminum deposited on them. On the left is a contact processed with single layer resist with 25 percent metal coverage on the sidewalls. On the right is a contact with slope produced with the sestertius cantilever structure with a spacer thickness of 2.5 microns with 60 percent metal.

Figure 7:
FIG. 7 shows a cross-section of contacts on topography with metal deposited over them produced with a sestertius cantilever mask with 1.5 micron spacer.

The slope of the contact is determined by the height of the mask and the degree of the velocity anistropy of the ions which assist the etch and cause the etch to be anisotropic. The velocity anisropy is determined by the etch process, but is not a sensitive function of the oxide etch parameters. The mask height will vary over the topography of the wafer and cause some predictable variation of slopes. (That is, for example, where contacts are being cut simultaneously to substrate and to the polysilicon gate level, the spacer layer will be somewhat thicker over the contacts to substrate, and therefore the contacts to substrate will have more gently sloped sidewalls). FIG. 7 shows a cross section through contacts at various topography positions. The metal coverage is good on all the contacts.

The sestertius cantilevered mask approach involves extra coat and develop steps to pattern the mask and spacer materials and to remove the mask structure.

Some advantages of the present invention include:

It requires only a one step etch.

The slope of the contact is determined primarily by the cantilevered mask spacer thickness, and can thus be altered as desired.

The sizing of the contact is determined by the size of the printed contact in the top imaging layer.

The sestertius resist is removed in a standard resist strip process.

It uses a high resolution multilayer resist process.

The etch profile has naturally rounded corners.

No problems of cracking can occur, as can happen with hardmasks.

Deposition of the layers used is much simpler, because no hardmask layer needs to be deposited.

Of course the oxide layer so frequently referred to in the present application does not have to be strictly silicon dioxide, since the present invention is also applicable to other materials which are now or may in the future be used for interlevel dielectrics. Once the cantilever etch mask structure has been formed, a very wide variety of materials can be etched with sloped sidewalls, by using the shadowing effects of the cantilever etch mask to modify the anisotropicity of the contact etch as discussed above. Thus, the unique advantages of the present invention in providing a cantilever etch mask structure can also be applied to many other interlevel dielectric materials.

It should also be noted that the top layer of resist is not critical; the requirements for the top layer of resist are simply (1) that it be coatable to a small thickness with good adhesion; (2) that it be developable under conditions which will not remove the underlying spacer layer; and (3) that it be durable enough to mask the etch of the dielectric to produce the actual contact holes.

The anti-reflective coating used in the presently preferred embodiment is not critical at all, and many other compounds could be substituted, as long as they have acceptable adhesion properties. Moreover, the anti-reflective function could be accomplished in other ways, such as by using a dyed resist for the spacer layer or an anti-reflective coating under the spacer layer.

The requirements of the spacer layer are simply that it be relatively insensitive to some wavelength which will expose the top layer resist; that it be sensitive to some wavelength to which the top layer resist is relatively opaque; that it be developable under conditions which will not attack the top layer resist; and, preferably, that it have physical properties which permit it to be readily coated on as a planarizing layer. PMMA (polymethylmethacrylate) has all these desirable properties when used as a spacer layer under conventional top layer resists, but other compositions meeting these requirements could be used instead of PMMA.

It should also be noted that other exposure wavelengths can be used besides those given; for example, PMMA can be exposed at longer or shorter wavelengths than 220 nm (although at much shorter wavelengths the PMMA will be excessively opaque, and at much longer wavelengths the PMMA will be insufficiently photosensitive).

Moreover, a tremendous variety of oxide-etching chemistries can be used with the present invention; e.g. $CF_4$, $C_2F_6$, $C_3F_8$, $CHF_3$, $BF_3$, $NF_3$, etc., can be used. Any oxide etch which is selective to the photoresist used (and preferably also to silicon) can be used.

It should also be noted that the top layer need not be a strictly organic material; for example, silicon-bearing photoresists (such as have recently been widely discussed in the literature) could be used instead. In the present state of the art, the crucial advantages of the materials used are easy deposition, easy removal, and lack of cracking problems; but it may in the future be possible to flow on (or spray-coat) other photosensitive materials, such as organo-silane polymers, chalcogenide or other inorganic glasses, etc., and the present invention is also applicable to such future developments. Another important advantage of the present invention is simple removal (by ashing), and other photosensitive materials may become satisfactory in this respect also.

Thus, one way to regard the teaching of the present invention is that the undercutting necessary for cantilever etch mask technology to work is achieved by using two photosensitive materials which are sensitive at different wavelengths, so that differential exposure sensitivities rather than differential etching characteristics can be used to form the undercut structure required. This inventive step provides major advantages over the prior art.

As will be appreciated by those skilled in the art, the present invention can be widely modified and varied, and its scope is not limited except as specified in the allowed claims.

What is claimed is:

1. A method of fabricating integrated circuits, comprising the steps of:
   (a) providing a partially fabricated integrated circuit structure having a dielectric thereon overlying predetermined contact hole locations;
   (b) coating a photosensitive spacer layer onto said partially fabricated integrated circuit structure;
   (c) coating a photosensitive top layer over said spacer layer;
   (d) exposing said top layer at a first wavelength to which said top layer is photosensitive and said spacer layer is not photosensitive to define said predetermined contact hole locations, and
   (e) developing said top layer to define apertures over said contact hole locations in said top layer;
   (f) exposing said top layer and said spacer layer at a second wavelength to which said top layer is substantially opaque and said spacer layer is photosensitive to expose said spacer layer in accordance with said apertures in said top layer, said second wavelength exposing step being performed for at least twice the duration required to completely expose portions of said spacer layer beneath the center of said apertures in said top layer, and
   (g) developing said top spacer layer so that said spacer layer is undercut to define apertures in said spacer layer which underlie said apertures in said top layer but have a minimum width more than twice the minimum width of said apertures in said top layer; and
   (h) dry etching said dielectric with said patterned top layer and spacer layer thereover, whereby said dielectric is etched to have contact holes in said predetermined pattern, and said contact holes have sloped sidewalls.

2. The method of claim 1, further comprising the additional step, subsequent to said etching step (h), of
   (i) coating a metal overall, whereby said metal makes contact to portions of said partially fabricated integrated circuit structure at the bottoms of said contact holes without open circuits in said metal near the sidewalls of said contact holes.

3. The method of claim 1, further comprising the additional step, prior to said coating step (c) and subsequent to said coating step (b), of
   (j) coating an antireflective coating over said spacer layer;
   (e) wherein said developing step (e) also removes portions of said antireflective coating beneath said apertures in said top layer.

4. The method of claim 1, wherein said developing step (g) is performed for at least twice the duration required to completely remove exposed portions of said spacer layer directly beneath the centers of said apertures in said top layer.

5. The method of claim 1, wherein said spacer layer consists essentially of polymethylmethacrylate (PMMA).

6. The method of claim 1, wherein said step (c) of coating on said spacer layer applies said spacer layer in a planarizing fashion, whereby said top layer is more planar than portions of said partially fabricated integrated circuit structure underlying said spacer layer.

7. The method of claim 1, wherein said etching step (h) exposes portions of said partially fabricated integrated circuit structure under said dielectric which include both a substrate and an insulated conductive line running over said substrate.

8. The method of claim 1, wherein said etching step (h) exposes portions of said partially fabricated integrated circuit structure under said dielectric which include both a first insulated conductive line running over a substrate and also a second insulated conductive line running over said first insulated conductive line and over said substrate.

* * * * *